(12) United States Patent
Meitl et al.

(10) Patent No.: US 9,773,945 B2
(45) Date of Patent: Sep. 26, 2017

(54) METHOD FOR PRODUCING A SEMICONDUCTOR COMPONENT AND A SEMICONDUCTOR COMPONENT

(71) Applicants: OSRAM Opto Semiconductors GmbH, Regensburg (DE); X-Celeprint Limited, Cork (IE)

(72) Inventors: Matthew Meitl, Durham, NC (US); Christopher Bower, Raleigh, NC (US); Tansen Varghese, Regensburg (DE)

(73) Assignees: OSRAM Opto Semiconductors GmbH, Regensburg (DE); X-Celeprint Limited, Cork (IE)

( * ) Notice: Subject to any disclaimer, the term of this patent is extended or adjusted under 35 U.S.C. 154(b) by 0 days.

(21) Appl. No.: 15/009,736

(22) Filed: Jan. 28, 2016

(65) Prior Publication Data

US 2016/0225953 A1   Aug. 4, 2016

Related U.S. Application Data

(60) Provisional application No. 62/110,365, filed on Jan. 30, 2015.

(51) Int. Cl.
*H01L 33/38* (2010.01)
*H01L 33/22* (2010.01)
(Continued)

(52) U.S. Cl.
CPC .......... *H01L 33/22* (2013.01); *H01L 25/0753* (2013.01); *H01L 33/007* (2013.01);
(Continued)

(58) Field of Classification Search
None
See application file for complete search history.

(56) References Cited

U.S. PATENT DOCUMENTS

| 2007/0170458 A1* | 7/2007 | Mitani | H01L 33/505 257/103 |
| 2009/0073350 A1* | 3/2009 | Toyama | G02F 1/133603 349/69 |

(Continued)

FOREIGN PATENT DOCUMENTS

| DE | 102007019776 A1 | 10/2008 |
| EP | 2757603 A1 | 7/2014 |

*Primary Examiner* — Angel Roman
*Assistant Examiner* — Kevin Quinto
(74) *Attorney, Agent, or Firm* — Slater Matsil, LLP

(57) ABSTRACT

A method for producing a plurality of semiconductor components and a semiconductor component is disclosed. In some embodiment, the method includes forming a semiconductor layer sequence, structuring the semiconductor layer sequence by forming trenches thereby structuring semiconductor bodies, applying an auxiliary substrate on the semiconductor layer sequence, so that the semiconductor layer sequence is arranged between the auxiliary substrate and the substrate and removing the substrate from the semiconductor layer sequence. The method further comprises applying an anchoring layer covering the trench and vertical surfaces of the semiconductor bodies, forming a plurality of tethers by structuring the anchoring layer in regions covering the trench, locally detaching the auxiliary substrate from the semiconductor bodies, wherein the tethers remain attached to the auxiliary substrate and selectively picking up a semiconductor body by separating the tethers from the auxiliary substrate, the semiconductor body including a portion of the layer sequence.

20 Claims, 12 Drawing Sheets

(51) Int. Cl.
    *H01L 33/00*          (2010.01)
    *H01L 25/075*        (2006.01)
    *H01L 33/32*          (2010.01)
    *H01L 33/46*          (2010.01)

(52) U.S. Cl.
    CPC ...... *H01L 33/0079* (2013.01); *H01L 33/0095* (2013.01); *H01L 33/32* (2013.01); *H01L 33/382* (2013.01); *H01L 33/465* (2013.01); *H01L 2933/0033* (2013.01); *H01L 2933/0058* (2013.01)

(56) References Cited

U.S. PATENT DOCUMENTS

| | | |
|---|---|---|
| 2010/0117111 A1 | 5/2010 | Illek et al. |
| 2010/0248484 A1 | 9/2010 | Bower et al. |
| 2011/0136271 A1 | 6/2011 | von Malm |
| 2014/0361409 A1 | 12/2014 | Rogers et al. |

* cited by examiner

METHOD FOR PRODUCING A SEMICONDUCTOR COMPONENT AND A SEMICONDUCTOR COMPONENT

This application claims the benefit of U.S. Provisional Application No. 62/110,365, filed on Jan. 30, 2015, which application is hereby incorporated herein by reference.

TECHNICAL FIELD

The invention relates to a method for producing a semiconductor component and to a semiconductor component.

BACKGROUND

Area lighting using LEDs necessitates a large number of small LEDs to be die bonded on a carrier. This is time-consuming and expensive when using standard methods for producing the LEDs and using standard die bonding techniques.

SUMMARY

Embodiments of the invention provide a particularly flexible method for producing a semiconductor component or a plurality of semiconductor components. Other embodiments provide a semiconductor component which can be produced in a simplified and cost-effective manner.

In one embodiment of a method for producing a semiconductor component or a plurality of semiconductor components, a substrate is provided. The substrate can be patterned or flat. For example the substrate is radiation-transmissive, in particular, transparent. The substrate is, for example, a growth substrate, which may in this case consist inter alia of sapphire or silicon or contain sapphire or silicon.

According to at least one embodiment of the method for producing the semiconductor component comprises applying, for instance growing epitaxially, a semiconductor layer sequence having a first semiconductor layer, a second semiconductor layer and an active region onto the substrate.

The semiconductor layer sequence comprises a first main surface facing the substrate and a second main surface facing away from the substrate. The first main surface, for example, faces a surface of the substrate. The first and second main surfaces in particular delimit the semiconductor layer sequence in a vertical direction. A vertical direction is understood to mean a direction which is directed transversely, for instance perpendicularly, to a main extension plane of the active region. A lateral direction extends in parallel to the main extension plane of the active region. In particular, the lateral direction and the vertical direction are perpendicular to each other.

For example, the first semiconductor layer is formed as an n-conductive layer and the second semiconductor layer is formed as a p-conductive layer, or vice versa. The active region is disposed for instance between the first semiconductor layer and the second semiconductor layer. In particular, the active region is a pn-junction zone which is provided for generating or detecting electromagnetic radiation during the operation of the semiconductor component.

The semiconductor layer sequence is based, for example, on a III-V compound semiconductor material, which comprises at least one element from main group III, such as for example Al, Ga, In, and one element from main group five, such as for example N, P, As. In particular, the term "III-V compound semiconductor material" encompasses the group of binary, ternary and quaternary compounds, which contain at least one element from main group III and at least one element from main group five, for example, nitride and phosphide compound semiconductors. N-conductive and p-conductive layers may respectively be produced by appropriate doping of the semiconductor material. The semiconductor layer sequence may also be based on a II-VI compound semiconductor material.

According to at least one embodiment, a contact structure comprising at least a first contact area, a second contact area and a via is formed on the side of the second main surface. The via is electrically connected for instance to the first contact area. For electrically contacting the first semiconductor layer, the via may extend from the second main surface throughout the second semiconductor layer and the active region into the first semiconductor layer. It is also possible that the via also extends throughout the first semiconductor layer. The second contact area is electrically connected for instance to the second semiconductor layer.

In particular, the via covers vertical surfaces of a recess which is formed in the semiconductor layer sequence. In lateral directions, the recess may be completely surrounded by the semiconductor layer sequence. The recess may extend throughout the second semiconductor layer and the active region as far as into the first semiconductor layer and/or also throughout the first semiconductor layer. The recess may be formed by an etching method, for example, by a dry etching method. It is possible that a plurality of recesses and a plurality of vias are formed.

According to at least one embodiment, the semiconductor layer sequence is patterned on a side remote from the substrate, such that a patterned second main surface of the semiconductor layer sequence remote from the substrate is formed. The second main surface may comprise a plurality of micro-prisms. In particular, the second main surface is patterned prior to the step of forming the contact structure, for example, prior to the forming of the first contact area and the second contact area of the contact structure.

According to at least one embodiment, a mirror layer is applied on the patterned second main surface. The mirror layer in particular reproduces the patterned second main surface at least in places. The first main surface of the semiconductor layer sequence may be formed as a radiation exit area. Radiation emitted in the direction of the second main surface can be reflected towards the first main surface by the mirror layer.

According to at least one embodiment, an auxiliary substrate is applied on the semiconductor layer sequence, so that the semiconductor layer sequence is arranged between the auxiliary substrate and the substrate.

The first contact area and the second contact area of the contact structure are arranged in particular completely between the auxiliary substrate and the semiconductor layer sequence. The auxiliary substrate may comprise a polymer, which is particularly suitable for a temporary bonding process due to its temperature-dependent properties.

The auxiliary substrate may be mechanically fixed, in particular temporarily bonded, to the semiconductor layer sequence by a connecting layer. For example, the connecting layer comprises a bonding material which may be applied on the semiconductor layer sequence by a spin coating method. For instance the connecting layer contains a spin-on bonding material which temporarily bonds the auxiliary substrate to the semiconductor layer sequence, wherein the connecting layer is able to timely release the auxiliary substrate from the semiconductor layer sequence. The connecting layer comprises for instance a thermally decomposable spin-on bonding material having temperature-dependent adhesion.

It is also possible to use other suitable materials for the connecting layer. For example, the connecting layer may be formed from a photoresist material. Using a photoresist material, the connecting layer may be dissolved in a simplified manner, for example, by means of a photolithography process.

According to at least one embodiment, the substrate is removed from the semiconductor layer sequence. In particular, the auxiliary substrate is applied prior to the process of removing the substrate. The recess and the via or the plurality of recesses and vias may be formed prior to or after removing the substrate.

According to at least one embodiment, the semiconductor layer sequence is structured into a plurality of semiconductor bodies. The semiconductor layer sequence may be divided into a plurality of semiconductor bodies, for example, by forming at least one or a plurality of trenches separating the semiconductor bodies in the lateral direction.

Structuring the semiconductor layer sequence may proceed, for example, by means of an etching and/or a laser separation method for forming the mesa trench or the plurality of trenches. The trench may extend from the first main surface throughout the semiconductor layer sequence as far as or into the connecting layer or also throughout the connecting layer as far as or into the auxiliary substrate. By way of example, the trench or trenches is/are formed such that the auxiliary substrate is partially exposed. After structuring the semiconductor layer sequence, the semiconductor bodies arranged on the auxiliary substrate are in particular electrically insulated from one another. It is also possible that the step of structuring the semiconductor layer sequence into a plurality of semiconductor bodies is performed prior to the process of fixing the auxiliary substrate to the semiconductor layer sequence.

According to at least one embodiment, the semiconductor layer sequence is applied onto an unpatterned, for example, a flat or a plane surface of the substrate, so that the first main surface of the semiconductor layer sequence may be unpatterned. After removing the substrate, the first main surfaces of the semiconductor bodies may be patterned, for example, by means of an etching method. It is possible that structuring the semiconductor layer sequence into a plurality of semiconductor bodies and patterning the first main surfaces of the semiconductor bodies are realized in a mutual process step or in two directly consecutive steps. On the other hand, the substrate may be provided with a patterned surface and the semiconductor layer sequence may be applied onto the patterned surface of the substrate. The first main surface of the semiconductor layer sequence is in particular patterned prior to removing the substrate. For example, the first main surface reproduces the patterned surface of the substrate.

According to at least one embodiment, an anchoring layer is applied onto the structured semiconductor layer sequence, wherein the anchoring layer covers the trench or the plurality of trenches and vertical surfaces of the semiconductor bodies. In particular, the anchoring layer is in direct physical contact with the auxiliary substrate. The anchoring layer can be a dielectric layer which contains for instance silicon, such as silicon oxide or silicon nitride. The anchoring layer can be applied to the semiconductor bodies, for example, by sputtering or coating, such as chemical or physical vapor deposition. It is also possible that the anchoring layer is formed by a photoresist layer. Using a photoresist material, the anchoring layer can be structured in a simplified manner, for example, by means of a photolithography process.

According to at least one embodiment, a plurality of tethers are formed by structuring the anchoring layer in the region covering the trench. In particular, the tethers are formed within the trench or trenches. In this case the tethers are arranged laterally from the active regions of the semiconductor bodies in plan view. The tether or the plurality of tethers may be formed by etching the anchoring layer. A photolithography process may be used for forming the plurality of tethers containing the photoresist material.

According to at least one embodiment, the anchoring layer is structured so that the tethers associated with different semiconductor bodies are disconnected. It is also possible that at least an anchor bar is formed between the semiconductor bodies by structuring the anchoring layer in the region covering the trench or the plurality of trenches, wherein the semiconductor bodies are connected to the anchor bar by the tethers. The anchor bar, for example, extends along at least one trench separating the semiconductor bodies. The anchor bar additionally helps holding the semiconductor bodies in place during the step of detaching the auxiliary substrate from the semiconductor bodies.

According to at least one embodiment, the auxiliary substrate is locally detached from the semiconductor bodies. Locally detaching the auxiliary substrate from the semiconductor bodies means in particular that the auxiliary substrate is separated from the semiconductor bodies at least in those regions of the auxiliary substrate covered by the active regions or by the semiconductor bodies. The semiconductor bodies, however, may still be connected to the auxiliary substrate indirectly, for example, by means of the tethers arranged at least partially sideways from the semiconductor bodies. Locally detaching the auxiliary substrate may be achieved by dissolving the mechanical connection between the auxiliary substrate and the semiconductor bodies at the connecting layer, for example, by removing the connecting layer or by timely changing the adhesive effect of the connecting layer.

The local detachment of the auxiliary substrate may proceed after the forming of the tethers. During and after the step of locally detaching the auxiliary substrate from the semiconductor bodies, the tethers remain in particular attached directly or indirectly to the auxiliary substrate. In this case, the semiconductor bodies may be held in place at least during the step of locally detaching the auxiliary substrate. After the step of locally detaching the auxiliary substrate from the semiconductor bodies, the auxiliary substrate is separated from the semiconductor bodies at least in those regions of the auxiliary substrate covered by the active regions or by the semiconductor bodies. The auxiliary substrate, however, is preferably mechanically connected to the semiconductor bodies indirectly by the tethers, in particular in those regions of the auxiliary substrate covered by the tethers.

According to at least one embodiment, at least one semiconductor body having one first semiconductor layer, one second semiconductor layer and one active region together with the associated contact structure is selectively picked out by separating the tethers from the auxiliary substrate. Separating the tethers from the auxiliary substrate may be performed by mechanically breaking the tethers or by releasing or dissolving the tethers from the auxiliary substrate. The at least one semiconductor body may be then separated completely from the auxiliary substrate and transferred to a carrier, such as an interposer or a final board. The semiconductor body, which is mechanically connected to the auxiliary substrate in particular only by means of the tethers, may be selectively removed by a stamp attached to the semiconductor body on the side of its first main surface. By lifting away the semiconductor body from the auxiliary substrate, the tethers attaching the semiconductor body to the auxiliary substrate can be mechanically broken or released, so that the semiconductor body is separated completely from the auxiliary substrate. It is also possible that a plurality of the semiconductor bodies are selectively removed simultaneously or one after another from the auxiliary substrate.

In accordance with at least one embodiment of a method for producing a plurality of semiconductor components each having a semiconductor body, the method comprises applying a semiconductor layer sequence on a substrate, wherein the semiconductor layer sequence comprises a first semiconductor layer, a second semiconductor layer and an active region being disposed between the first and the second semiconductor layers.

A contact structure is formed for electrically contacting the first semiconductor layer and the second semiconductor layer.

For electrically contacting the first semiconductor layer, by way of example, the contact structure comprises at least one via or a plurality of vias extending throughout the second semiconductor layer and the active region. The semiconductor layer sequence is structured into a plurality of semiconductor bodies by forming at least one trench or a plurality of trenches separating the semiconductor bodies. An auxiliary substrate is applied on the semiconductor layer sequence, so that the semiconductor layer sequence is arranged between the auxiliary substrate and the substrate. In a subsequent step, the substrate is removed from the semiconductor layer sequence. An anchoring layer is applied on the auxiliary substrate to cover the trench or trenches and vertical surfaces of the semiconductor bodies. In a next step, a plurality of tethers are formed by structuring the anchoring layer in regions covering the trench or trenches. After forming the tethers, the auxiliary substrate is locally detached from the semiconductor bodies, while the tethers remain attached to the auxiliary substrate. Each individual semiconductor body or a plurality of the semiconductor bodies may then be selectively picked up from the auxiliary substrate by separating the tethers from the auxiliary substrate, wherein the semiconductor body comprises one first semiconductor layer, one second semiconductor layer and one active region together with one associated contact structure.

Using the tethers' binding to the auxiliary substrate, wherein the tethers connected to the semiconductor bodies are formed after forming a plurality of trenches separating or isolating the semiconductor bodies from each other, each individual semiconductor body may be held in place by the tethers during the step of locally detaching the auxiliary substrate from the semiconductor bodies. In a subsequent step, the semiconductor bodies may be selectively picked up, for example, by a stamp, by breaking or releasing the tethers from the auxiliary substrate. The semiconductor bodies can be transferred one after the other or in a large number simultaneously to a carrier, such as an interposer or a final board.

According to at least one embodiment, the semiconductor component is formed by means of a direct-bonding method, wherein a main body comprising the semiconductor body and the contact structure of the semiconductor component is direct-bonded to the carrier of the semiconductor component. Direct-bonding means that the process of connecting of the main body to the carrier is in particular free of using any adhesive material.

The main body comprises, for example, an insulating layer which is formed on a side of the semiconductor body facing the first contact area and the second contact area. The main body may have a planar connection surface which delimits the main body in a vertical direction. This planar connection surface may be formed by surfaces, in particular exposed lateral surfaces of the first contact area, the second contact area and the insulating layer.

The carrier may comprise a first contact pad, an insulating pad and a second contact pad laterally separated from the first contact pad by the insulating pad. Preferably the carrier has a planar bonding surface which, for example, is formed by surfaces, in particular exposed lateral surfaces, of the first contact pad, the second contact pad and the insulating pad. The planar bonding surface and the planar connecting surface may be brought together directly to form a common interface between the main body and the carrier. The common interface is at least locally planar. The common interface may comprise a hole, where the planar bonding surface and the planar connecting surface are not in direct contact in places. Preferably, the common interface is globally planar. The common interface is in particular free of steps and edges.

By way of example, the common interface is formed partially by a metal-metal-interface, an insulating-insulating-interface and partially by a metal-insulating-interface. The semiconductor component may then be free of an adhesive material at the common interface between the carrier and the main body, wherein the carrier and the main body are fixed to each other in particular at the common interface. In this case, the first contact area and the second contact area may be in direct electrical contact to the first contact pad and the second contact pad, respectively. Using the direct-bonding method, electrical interconnection of the main body and the carrier can be realized without any extra step, such as wire bonding or plating electrical tracks on the main body.

In a direct-bonding method, two bodies, each having a planar surface, are brought together at a suitable pressure and a suitable temperature and are mechanically connected with each other due to van der Waals interactions or hydrogen bonds between the atoms on the planar surfaces. A planar surface is understood to mean a surface which is in particular formed microscopically flat. For example, such a planar surface has a roughness which is, for example, smaller than 50 nm, for example, smaller than 10 nm, and in particular smaller than 1 nm. Preferably, such a planar surface is free of edges. In particular, this bonding technique does not call for the use of any bonding material, such as an adhesive or a soldering material. Apart from that, it is also possible that the carrier and the main body be connected to each other by means of an alternative method using a bonding material.

According to at least one embodiment, prior to the step of direct-bonding the planar bonding surface to the planar surface, the bonding surface and the connection surface are surface-finished and planarized for instance by a plasma cleaning method.

In accordance with at least one embodiment of a semiconductor component, the component has a main body and a carrier. The main body comprises a semiconductor body having a first main surface remote from the carrier and a second main surface facing the carrier. The semiconductor body comprises a first semiconductor layer, a second semiconductor layer and an active region being arranged between the first semiconductor layer and the second semiconductor layer. The main body comprises a contact structure having a via extending from second main surface throughout the second semiconductor layer and the active region for electrically contacting the first semiconductor layer. The contact structure further comprises a first contact area being electrically connected to the via and a second contact area on a side of the second main surface, wherein the first contact area and the second contact area are laterally separated by an insulating layer. The main body comprises a planar connection surface which is formed by surfaces of the first contact area, the second contact area and the insulating layer. The carrier comprises a planar bonding surface which is in direct contact with the planar connection surface of the main body, so that a common interface between the main body and the carrier is formed, wherein the common interface is free of an adhesive material. The common interface is in particular an overlapping region of the planar connection surface and planar bonding surface.

Preferably, the main body is mechanically fixed to the carrier at the common interface. The common interface is in particular free of macroscopic elevations and depressions or steps and edges. It is possible that a plurality of the main bodies are arranged on a single common carrier. The main bodies may be arranged in the form of a matrix having columns and rows.

Such a semiconductor component may be produced by the methods for producing a semiconductor component described herein. Therefore, features described in connection with the methods for producing a semiconductor component or a plurality of semiconductor components can also be used for the semiconductor component, and vice versa.

According to at least one embodiment of the semiconductor component, the second main surface is patterned and comprises a plurality of micro-prisms. The semiconductor component comprises for instance a mirror layer which is arranged between second main surface and the carrier and preferably reproduces the patterned second main surface at least in places. The active region is configured to generate electromagnetic radiation during operation of the semiconductor component, for example. The electromagnetic radiation may be coupled out from the semiconductor component at the first main surface. The efficiency of light out-coupling can be increased by means of the patterned mirror layer, since the patterned mirror layer reflects electromagnetic radiation towards the first main surface in various directions resulting in a reduction of negative effects due to total internal reflection at the first main surface.

According to at least one embodiment of the component, the carrier has a rear side remote from the bonding surface, wherein, in vertical direction, the first contact pad and the second contact pad extend from the bonding surface in particular throughout the carrier as far as the rear side. The component may be electrically contacted to an external power source by means of the first and the second contact pads on the rear side.

According to at least one embodiment of the component, phosphor particles and/or scattering particles are embedded in a layer covering the first main surface. Phosphor particles may absorb electromagnetic radiation emitted by the active region and re-emit an electromagnetic radiation having a longer peak wavelength in comparison with the electromagnetic radiation absorbed by the phosphor particles, so that the component may emit white light in total.

BRIEF DESCRIPTION OF THE DRAWINGS

For a more complete understanding of the embodiments of the present invention, and the advantages thereof, reference is now made to the following descriptions taken in conjunction with the accompanying drawings, in which.

Figure 1:
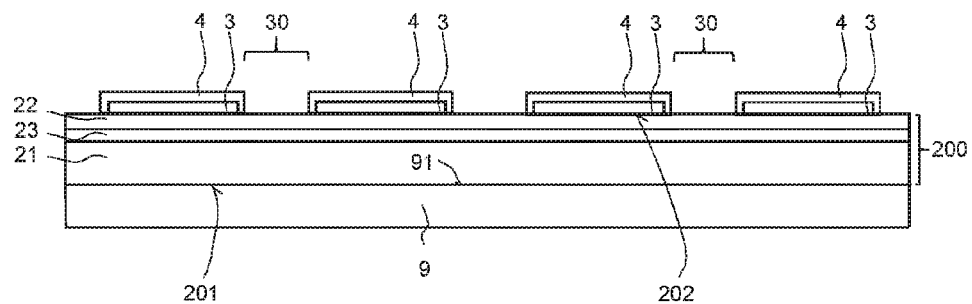
FIGS. 1 through 14 show schematic sectional views of various method stages for producing a plurality of semiconductor components.

Identical or similar elements, or elements acting in an identical manner, are provided with the same reference numerals in the figures. In each case, the figures are schematic views and are therefore not necessarily true to scale. Rather, comparatively small elements, and in particular layer thicknesses, may be illustrated excessively large for clarification purposes.

DETAILED DESCRIPTION OF ILLUSTRATIVE EMBODIMENTS

In FIG. 1, a substrate 9 is provided. The substrate 9 has a surface 91 which is flat. It is also possible that the substrate 9 comprises a patterned surface 91. The substrate 9 is, for example, radiation-transmissive, in particular transparent for electromagnetic radiation in visible, infrared and/or ultraviolet spectral ranges. Alternatively, the substrate 9 can be radiation-opaque. The substrate 9 may comprise gallium nitride or silicon carbide or sapphire. In particular, the substrate 9 is a silicon substrate.

A semiconductor layer sequence 200 is applied onto the surface 91 of the substrate 9. The semiconductor layer sequence 200 comprises a first semiconductor layer 21, a second semiconductor layer 22 and an active region 23 which is disposed between the first semiconductor layer 21 and the second semiconductor layer 22. The first semiconductor layer 21 may be an n-conductive layer and the second semiconductor layer 22 may be a p-conductive layer, or vice versa. The active region 23, for example, is configured for generating electromagnetic radiation or for absorbing and transforming electromagnetic radiation into electrical signals or energy.

The semiconductor layer sequence 200 may be grown epitaxially on the substrate 9. The semiconductor layer sequence 200 has a first main surface 201 facing the substrate 9 and a second main surface 202 which is remote from the substrate 9. For improving the quality of the epitaxial semiconductor layers of the semiconductor layer sequence 200, the substrate 9 may have a patterned surface 91. Moreover, the semiconductor layer sequence 200 can be grown onto the patterned surface 91 of the substrate 9, so that the first main surface 201 may reproduce the patterned surface 91.

A mirror layer 3 is deposited onto the second main surface 202 remote from the substrate 9. The mirror layer 3 comprises a plurality of subregions being laterally separated from one another. In particular, the mirror layer 3 comprises a plurality of openings 30. Each of the subregions of the mirror layer 3 may be continuous and comprises, for instance, at least one of the openings 30 of the mirror layer 3.

The mirror layer 3 is in particular electrically conductive. In top view, the mirror layer 3 is covered by a connection layer 4 which is, for example, also electrically conductive. The mirror layer 3 and/or the connection layer 4 may contain a metal such as aluminium, rhodium, palladium, silver, gold or platinum or alloys of these elements.

Figure 2:
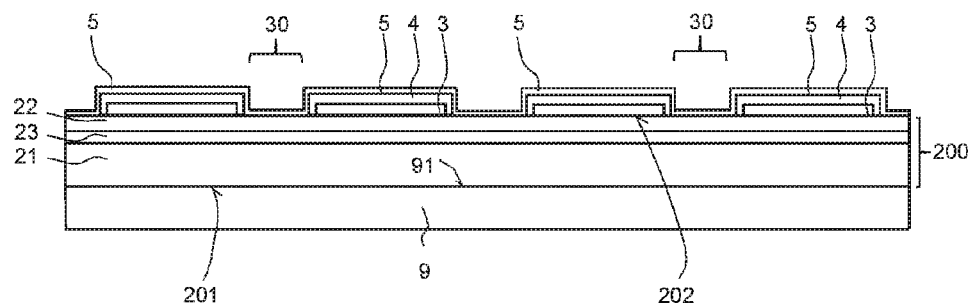

In FIG. 2, a dielectric layer 5, for example, a silicon nitride layer or a silicon oxide layer, is applied on the semiconductor layer sequence 200, wherein the dielectric layer 5 covers the connection layer 4 and in particular the semiconductor layer sequence 200 completely.

Figure 3:
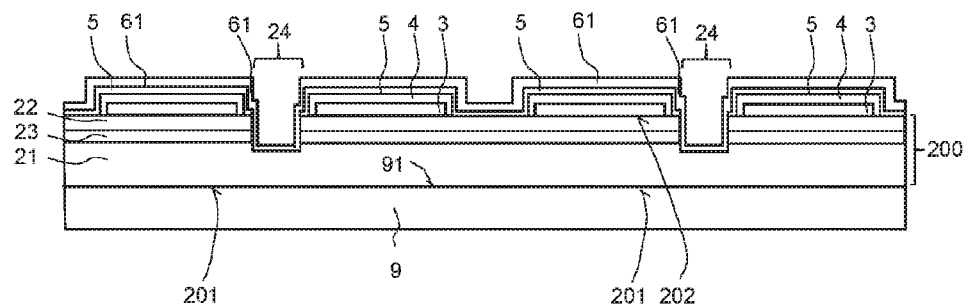

In FIG. 3, a plurality of recesses 24 are formed in regions of the openings 30 of the mirror layer 3. In vertical direction, each recess 24 extends throughout the dielectric layer 5, the second semiconductor layer 22, the active region 23 into the first semiconductor layer 21. The recess 24 forms a blind hole in the semiconductor layer sequence 200, wherein in lateral direction the recess 24 is surrounded by the semiconductor layer sequence 200 for instance completely. The recesses 24 may be formed by an etching method, for example, by a dry etching method.

After forming the recesses 24, a passivation layer 61, for example, a silicon oxide layer such as SiO2 or a silicon nitride layer, is formed to cover vertical surfaces of the recesses 24. It is possible that the passivation layer 61 covers the recesses 24 and the dielectric layer 5 completely. In a subsequent step, the passivation layer 61 may be partially removed. The passivation layer 61 and the dielectric layer 5 preferably comprise different dielectric materials. By way of example, the dielectric layer 5 contains or mainly consists of silicon nitride and the passivation layer 61 contains or mainly consists of silicon oxide.

Figure 4:
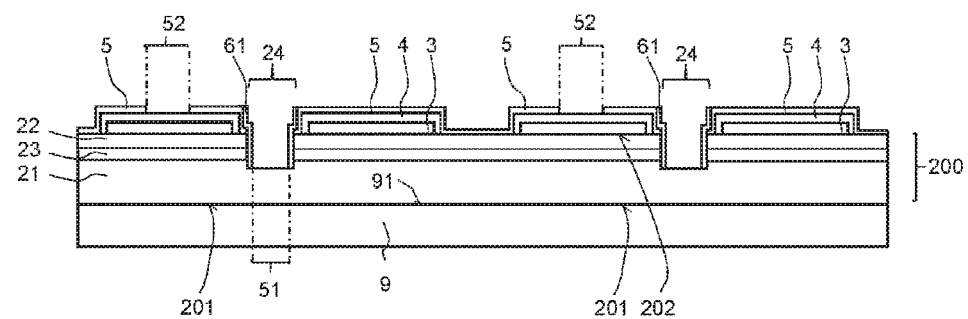

In FIG. 4 the passivation layer 61 is partially removed, for example, by etching, such that the first semiconductor layer 21 is exposed in the regions of the recesses 24. By partially removing the passivation layer 61, the dielectric layer 5 is also at least partially exposed. In a next step, the dielectric layer 5 is removed, for example, by etching, in places such that the dielectric layer 5 comprises in addition to first openings 51 in the regions of the recesses 24, a plurality of second openings 52 arranged laterally to the recesses 24. In the second openings 52, an electrically conductive layer such as the connection layer 4 is partially exposed.

Figure 5:
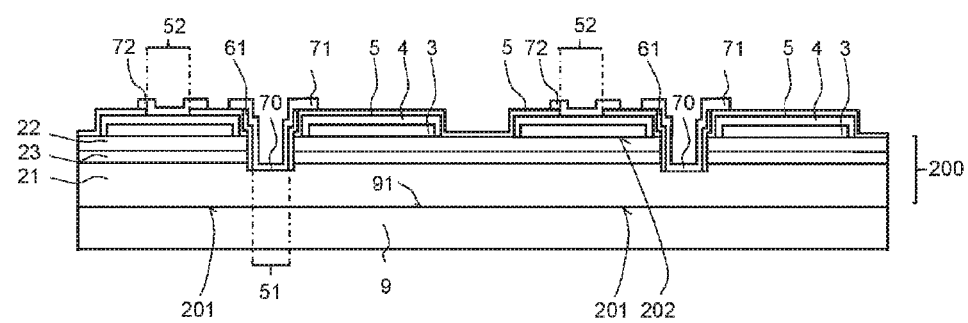

In FIG. 5, a contact structure 7 comprising a first contact area 71, a second contact area 72 and a via 70 is formed on the side of the second main surface 202 of the semiconductor layer sequence 200. The first contact area 71 and the second contact area 72 are laterally separated and in this way electrically isolated from each other. In vertical direction, the second contact area 72 extends through the second opening 52 of the dielectric layer 5 and is electrically connected to the second semiconductor layer 22 by means of the mirror layer 3 and the connection layer 4. The first contact area 71 is deposited outside the recess 24 and is electrically connected to the via 70, wherein the via 70 is arranged inside the recess 24. In vertical direction, the via 70 extends at least from the second main surface 202 throughout the second semiconductor layer 22 and the active region 23 into the first semiconductor layer 21. Within the recess 24, in lateral direction, the via 70 is electrically isolated from the second semiconductor layer 22 and the active region 23 by means of the passivation layer 61 covering vertical surfaces of the recess 24.

Figure 6:
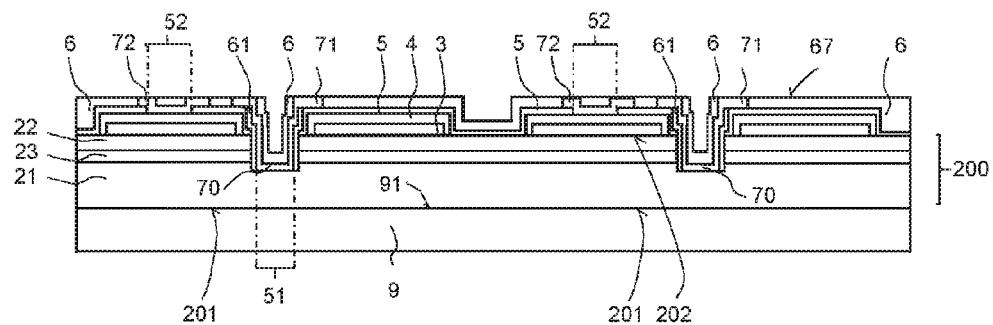

In FIG. 6, an insulating layer 6 is formed on the side of the second main surface 202 of the semiconductor layer sequence 200. By way of example, the insulating layer 6 covers the contact structure 7 completely at first. In a subsequent step, the insulating layer 6 can be planarized, so that a substantially flat, in particular a substantially planar connection surface 67 is formed. The connection surface 67 in FIG. 6 is formed for instance by surfaces of the first contact area 71, the second contact area 72 and of the insulating layer 6 remote from the semiconductor layer sequence 200. In other words, after being planarized, in vertical direction, the surface of insulating layer 6 is in particular flush with the surfaces of the first contact area 71 and of the second contact area 72. At the connection surface 67, the first contact area 71 and the second contact area 72 are partially exposed. Preferably outside the recesses 24 and the regions between the subregions of the mirror layer 3, the connection surface 67 is formed as a planar connection surface. It is also possible that the insulating layer 6 fills the recesses 24 completely.

Figure 7:
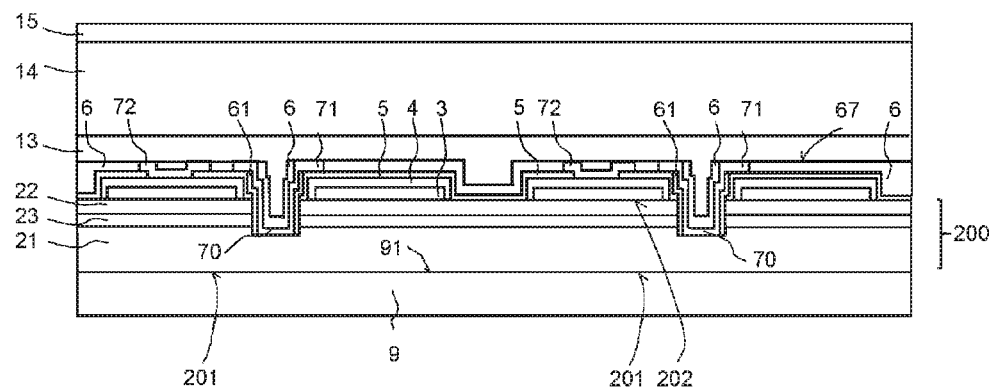

In FIG. 7, an auxiliary substrate 14 is temporarily fixed to the semiconductor layer sequence 200 by means of a connecting layer 13, so that the semiconductor layer sequence 200 is arranged between the auxiliary substrate 14 and the substrate 9. The auxiliary substrate 14 may comprise a polymer or is made of a polymer. The connecting layer 13 may comprise a bonding material which can be applied onto the connection surface 67 by a spin coating method. For instance the connecting layer 13 contains a spin-on bonding material which temporarily bonds the auxiliary substrate 14 to the semiconductor layer sequence 200 and timely releases the auxiliary substrate 14 from the semiconductor layer sequence 200. The connecting layer 13 comprises for instance a thermally decomposable spin-on bonding material having temperature-dependent adhesion. By way of example, a waferBOND® process (Brewer Science®) can be used which temporarily bonds the auxiliary substrate 14 to the semiconductor layer sequence 200 and later automatically debonds the auxiliary substrate 14 after a controllable length of time.

It is also possible to use other suitable materials for the connecting layer 13. For example, the connecting layer 13 may be formed from a photoresist material. Using a photoresist material, in particular a positive photoresist material, the connecting layer 13 may be dissolved in a simplified manner, for example, by means of a photolithography process. In this case, the auxiliary substrate 14 may be formed from a radiation-transmissive material, so that the connecting layer 13 comprising the photoresist material can be exposed to radiation passing through the auxiliary substrate 14. Preferably, a protection layer 15 is formed on the side of the auxiliary substrate 14 remote from the connecting layer 13. For example, the protection layer 15 is radiation-opaque and may be removed prior to the exposure of the photoresist material in the connecting layer 13. For example, the protection layer 15 is a Kapton® layer.

Figure 8:
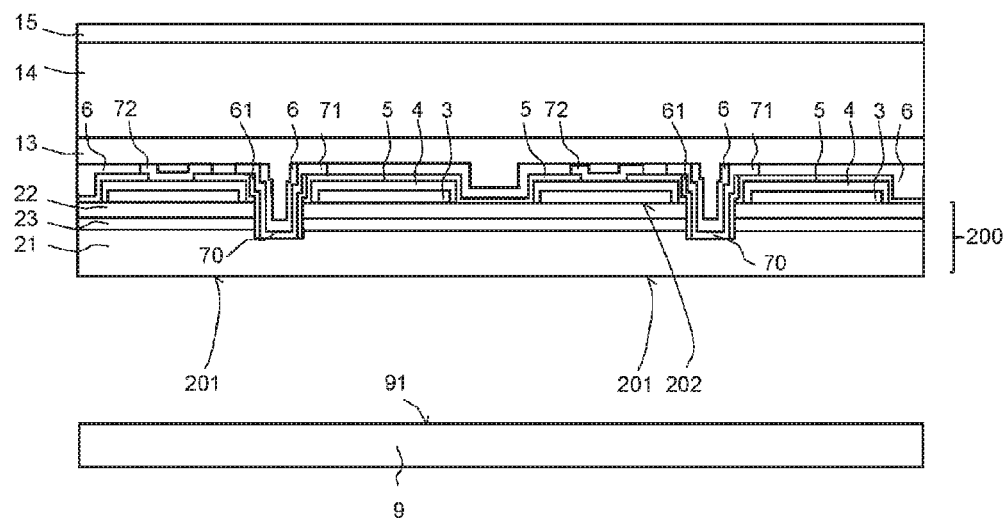

In FIG. 8, the substrate 9 is separated from the semiconductor layer sequence 200. This can be performed, for example, by means of a mechanical, chemical or physical process. For example etching, in particular dry etching, grinding or a laser separation process such as a laser lift-off process may be used. A combination of grinding and etching may also be used for removing the substrate.

Figure 9A:
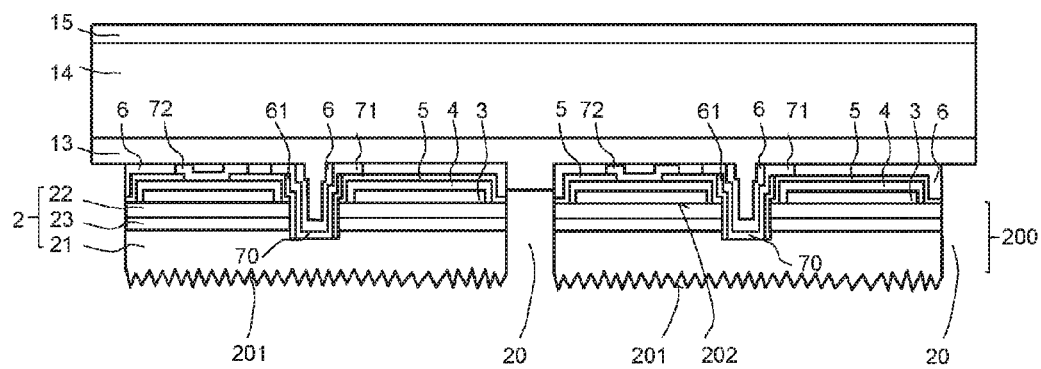

In FIG. 9A, the semiconductor layer sequence 200 is structured laterally into a plurality of semiconductor bodies 2. Lateral structuring means that the semiconductor layer sequence 200 is divided into a plurality of semiconductor bodies 2 being spaced laterally apart from one another. A mesa trench 20 or a plurality of trenches 20 are formed between the semiconductor bodies 2. In vertical direction, the trench 20 extends throughout the semiconductor layer sequence 200 as far as to the connecting layer 13. The trenches 20 may be formed by an etching method, for instance by a dry, wet or laser etching method, in particular in regions between the sub-regions of the mirror layer 3. The trench 20 may also be formed sideways from the semiconductor layer sequence 200. It is also possible that the step of structuring the semiconductor layer sequence 200 into a plurality of the semiconductor bodies 2 is performed prior to the process of fixing the auxiliary substrate 14 and removing the substrate 9.

In FIG. 9A the first main surfaces 201 of the semiconductor bodies 2 are patterned, resulting in an optimal light extraction surface 201. It is possible that forming the trenches 20 and patterning the first main surfaces 201 are realized in a mutual process step or in two directly consecutive steps. In particular, the step of forming the trenches 20 follows the step of patterning the first main surface 201 of the semiconductor layer sequence 200.

Figure 9B:
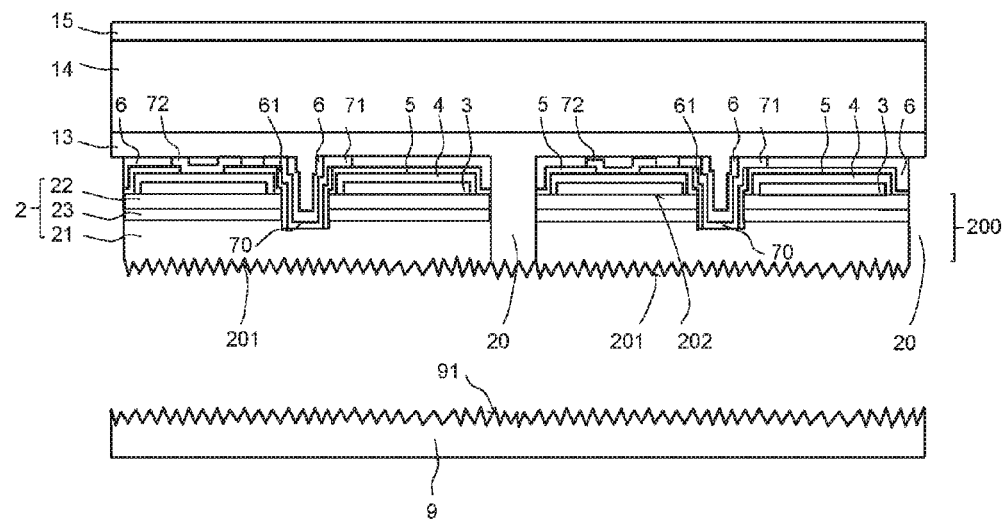

The production step illustrated in FIG. 9B corresponds substantially to the production step illustrated in FIG. 9A. In contrast thereto, the substrate 9 is provided with a patterned surface 91 onto which the semiconductor layer sequence 200 has been applied. In this case, the semiconductor layer sequence 200 comprises the first main surface 201 which is patterned and in particular reproduces the patterned surface 91 of the substrate 9. After removing the substrate 9 and structuring the semiconductor layer sequence 200, each semiconductor body 2 comprises a patterned first main surface 201.

Figure 10:
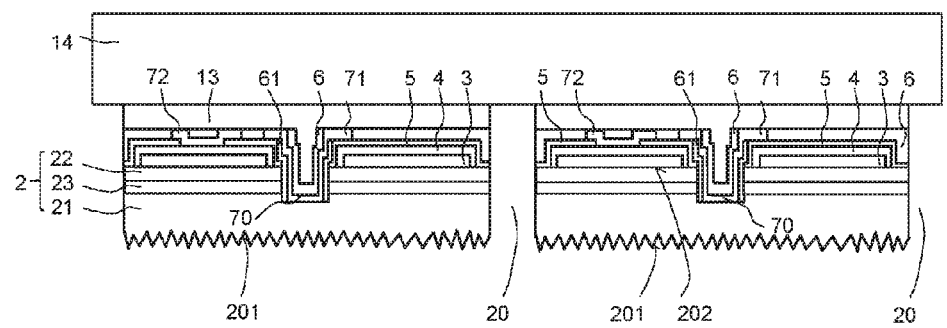

In FIG. 10, the connecting layer 13 is partially removed, so that the auxiliary substrate 14 is exposed in regions of the trenches 20. The connecting layer 13 in regions of the trenches 20 may be removed, for example, by using a solvent, by means of an etching method or by a photolithography process. Hereby, the protection layer 15 may be removed partially or completely.

Figure 11:
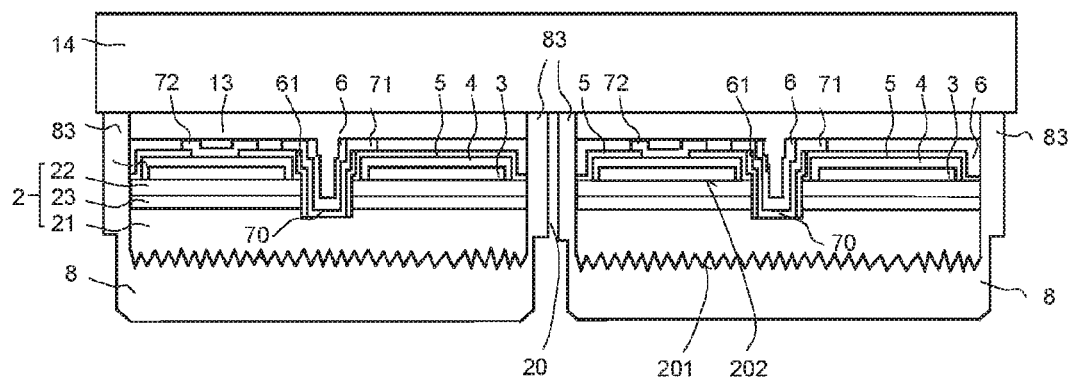

In FIG. 11, an anchoring layer 8 is applied onto the semiconductor bodies 2 and onto the auxiliary substrate 14 for instance by a coating method, wherein the anchoring layer 8 covers vertical surfaces of the semiconductor bodies 2 and the trench or trenches 20 arranged sideways of the semiconductor bodies 2. The anchoring layer 8 fixes the semiconductor bodies 2 to the auxiliary substrate. Preferably, the anchoring layer 8 is in direct physical contact with the auxiliary substrate 14. As shown in FIG. 11, the anchoring layer 8 may cover the vertical surfaces and/or the first main surface 201 of the semiconductor body 2 completely. It is possible that the auxiliary substrate 14 is formed to have a patterned surface facing the semiconductor bodies 2 (not shown). In this case, the anchoring layer 8 may penetrate onto the patterned auxiliary substrate 14 such that the anchoring layer 8 is anchored to the auxiliary substrate 14 in an optimal manner, since an interface between the auxiliary substrate and the anchoring layer is enlarged due to the patterned surface, so that an adhesion area on the patterned surface is increased.

The anchoring layer 8 may be formed from dielectric material such as silicon oxide or silicon nitride or from a photoresist material. For example the anchoring layer 8 comprises substantially a photoresist material or consists of a photoresist material. It is also possible that the anchoring layer 8 is formed substantially from a low temperature (<220° C.) dielectric or by a low temperature dielectric and a photoresist material.

After applying the anchoring layer 8, a plurality of tethers 83 are formed by structuring the anchoring layer 8 at least in regions covering the trench or trenches 20. The tethers 83 are in particular parts of the anchoring layer 8 which are arranged laterally to their associated semiconductor body 2. In top view onto the auxiliary substrate 14, the semiconductor body 2 may not have any overlaps with the tethers 83.

The tethers 83 are formed to mechanically fix the semiconductor body 2 to the auxiliary substrate 14. For structuring the anchoring layer 8, a photolithography process and/or an etching process may be used.

Figure 11A:
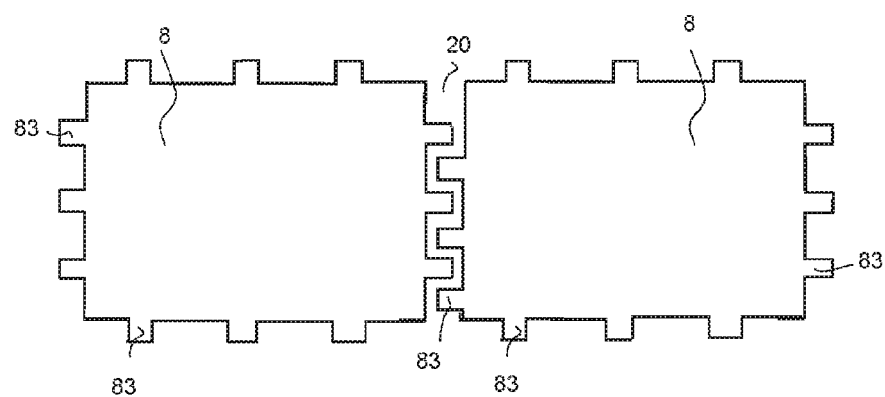

In FIG. 11A, the anchoring layer 8 comprising the tethers 83 is shown in a top view on the auxiliary substrate 14. Vertical surfaces of each of the semiconductor bodies 2 are covered by the anchoring layer 8. The anchoring layer 8 is structured into a plurality of laterally separated anchoring layers 8 associated with different semiconductor bodies 2. Each semiconductor body 2 comprises on its lateral sides at least one or a plurality of the tethers 83. The anchoring layer 8 is structured in regions covering the trenches 20 in such a way that tethers 83 associated with different semiconductor bodies 2 are disconnected. This simplifies the process of lifting up any individual semiconductor body 2 without having influence on its neighboring semiconductor bodies 2.

Figure 11B:
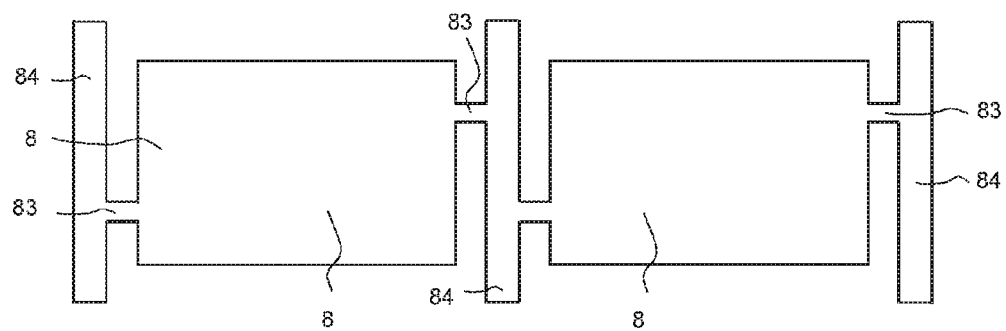

In FIG. 11B, anchor bars 84 as further parts of the anchoring layer 8 are formed between the semiconductor bodies 2. By way of example, the anchor bar 84 extends along a row of the semiconductor bodies 2 along a lateral direction. The tethers 83 are connected to the anchor bar 84. In this case neighboring semiconductor bodies 2 may be mechanically connected to each other by the tethers 83 and the anchor bars 84, so that a plurality of semiconductor bodies 2 may be lifted simultaneously in a simplified and safe manner.

Figure 12:
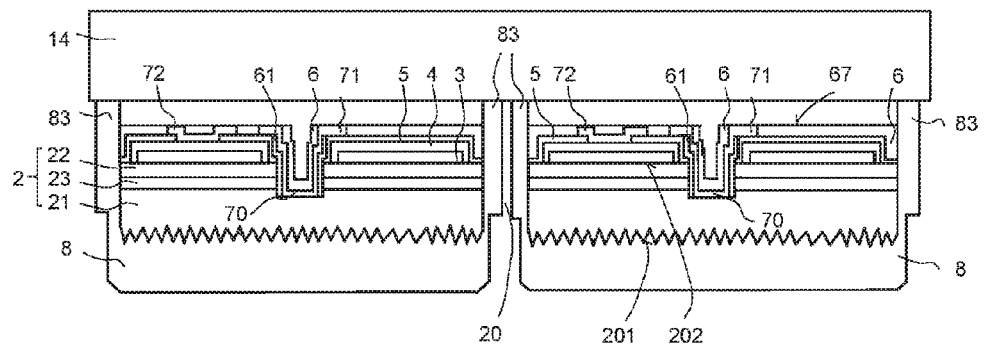

In FIG. 12, the auxiliary substrate 14 is locally detached from the semiconductor bodies 2. The semiconductor bodies 2, however, are still connected to the auxiliary substrate indirectly by means of the tethers 84. Locally detaching the auxiliary substrate 14 may be achieved by dissolving the mechanical connection between the auxiliary substrate 14 and the semiconductor bodies 2 at the connecting layer 13, for example, by using timed solvent removal of the connecting layer 13 or by timely changing the adhesive effect of the connecting layer 13. In the case that the connecting layer 13 is formed from a photoresist material, the connecting layer 13 may be dissolved out by being exposed to radiation which may be transmitted through the auxiliary substrate 14. It is possible that the step of forming the tethers 84 and the step of locally detaching the auxiliary substrate 14 are realized in a mutual process step, for example, by a photolithography process.

Figure 13:
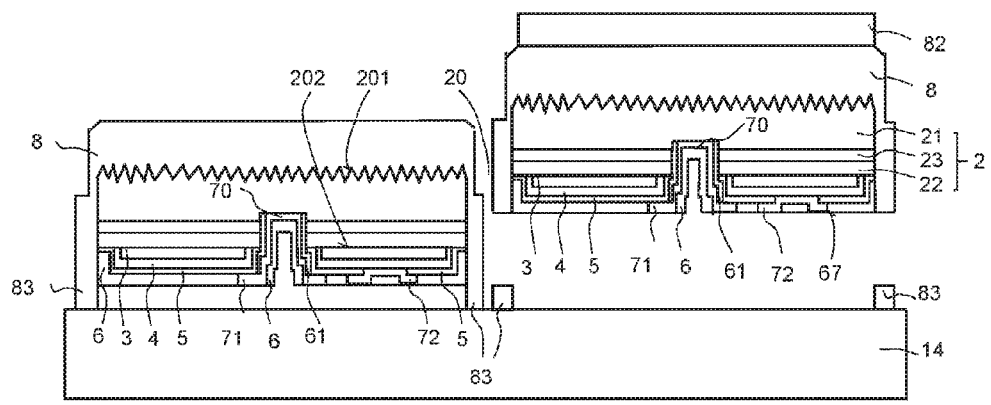

In FIG. 13, a stamp 82 is attached to the semiconductor body 2 on the side of the first main surface 201. The semiconductor body 2 having one first semiconductor layer 21, one second semiconductor layer 22 and one active region 23 together with the associated contact structure 7 having the via 70 may be selectively picked up by the stamp and lifted from the auxiliary substrate 14 such that the tethers 83 are separated from the auxiliary substrate 14. For instance, the tethers 83 are mechanically broken or released from the auxiliary substrate 14. It is possible that the tethers 83, or at least some remnants of the tethers 83, are detached from the auxiliary substrate 14, so that the anchoring layer 8 still comprises the tethers 83 or at least some remnants of the tethers 83 after the semiconductor body 2 has been completely removed from the auxiliary substrate 14. It is also possible to selectively pick up a plurality of semiconductor bodies 2 simultaneously.

Figure 14:
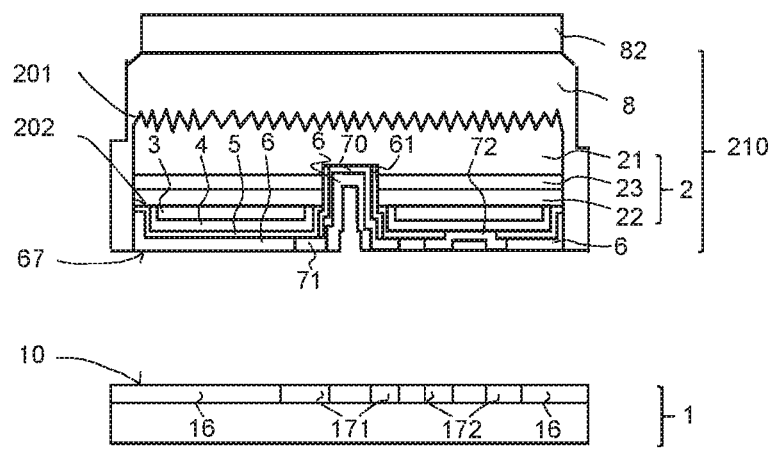

In FIG. 14, a main body 210 having the semiconductor body 2, the mirror layer 3, the connection layer 4, the dielectric layer 5, the insulating layer 6, the passivation 61 and the contact structure 7 is transferred by the stamp 82 and mechanically connected to a carrier 1 having a first contact pad 171 and a second contact pad 172 laterally separated from the first contact pad by an insulating pad 16. The carrier 1 comprises, for example, a planar bonding surface 10 which is formed by surfaces of the first contact pad 171, the second contact pad 172 and the insulating pad 16. The main body 210, at least outside the recess 24, comprises a planar connection surface 67 which is formed by surfaces of the first contact area 71, the second contact area 72 and of the insulating layer 6. It is also possible that the recess 24 is filled with the insulating layer 6 completely. The bonding surface 10 and the connection surface 67 may be surface-finished and planarized, for example, by a plasma cleaning method.

Figure 15:
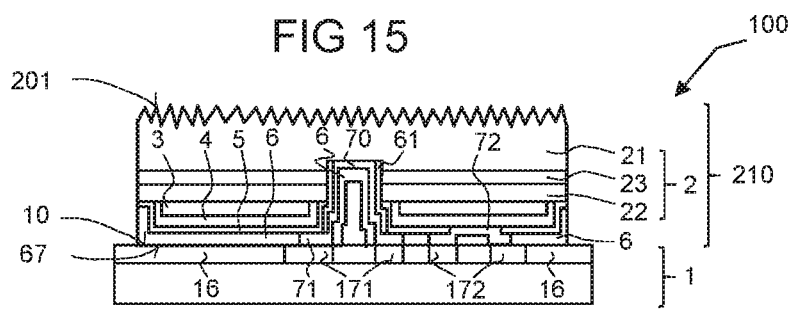
FIGS. 15 and 16 show exemplified embodiments of a semiconductor component.

In particular the main body 210 and the carrier 1 are connected to each other by a direct-bonding method. In this case, the bonding surface 10 is in direct contact with the connection surface 67, so that a common interface between the main body 210 and the carrier 1 is formed, wherein the common interface is a planar surface and free of an adhesive material. The common interface is formed in particular by directly overlapping regions of the connection surface 67 and the bonding surface 10. The first contact area 71 and the second contact area 72 are in particular in direct electrical contact to the first contact pad 171 and the second contact pad 172, respectively. For example, the common interface is formed partially by a metal-metal-interface, an insulating-insulating-interface and a metal-insulating-interface (FIG. 15). In contrast thereto, it is also possible that the main body 210 is connected to the carrier 1 by a method using an adhesive material.

In FIG. 15, a semiconductor component 100 produced by a method described herein is shown. At the common interface formed by the directly overlapping regions of the connection surface 67 and the bonding surface 10, the first contact area 71 together with the first contact pad 171 and the second contact area 72 together with the second contact pad 172 in each case form a step, i.e. a jump, in the vertical direction. This provides a hint that the contact areas and the contact pads are not formed in a single common production step but in different production steps and are connected to each other by the direct-bonding method. In FIG. 15, the anchoring layer 8 is completely removed from the semiconductor component 100. In particular, an encapsulation layer may be applied on the semiconductor body 2 which comprises for instance phosphor and/or scattering particles embedded in a matrix material of the encapsulation layer. In the case that the anchoring layer 8 is formed by a radiation-transmissive or radiation-transparent material, the anchoring layer 8 may not need to be removed and can serve as the encapsulation layer of the semiconductor layer component 100.

Figure 16:
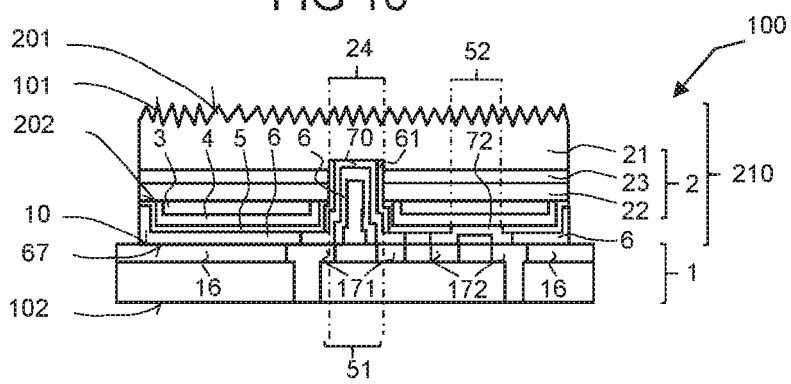

FIG. 16 schematically illustrates a further exemplary embodiment of the semiconductor component 100. This embodiment corresponds substantially to the embodiment of the semiconductor component 100 in FIG. 15. In contrast thereto, in vertical direction the first contact pad 171 and the second contact pad 172 extend from the bonding surface 10 throughout the carrier 1 to a rear side 102 of the substrate. The component 100 may be electrically contacted to an external power source, for example, by means of the first and the second contact pads 171 and 172 on the rear side 102.

The first main surface 201 is formed as a radiation passage area 101, in particular as a radiation exit area of the component. It is also possible, that the radiation exit area is protected by a further layer.

FIGS. 17A to 17H illustrate some further steps of a method for producing a plurality of semiconductor components 100.

Figure 17A:
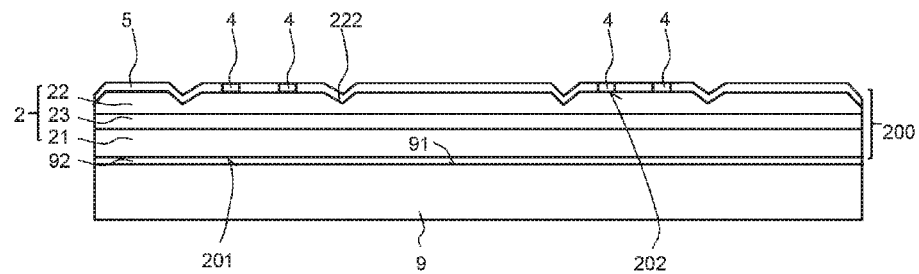
FIGS. 17A through 17H show schematic sectional views of various method stages of further embodiments of a method for producing a plurality of semiconductor components.

The production step illustrated in FIG. 17A corresponds essentially to the production step described in FIG. 1. In contrast thereto, the semiconductor layer sequence 200 is patterned on a side remote from the substrate 9, such that a patterned second main surface 202 of the semiconductor layer sequence 200 is formed which comprises a plurality of micro-prisms 222. Furthermore, the connection layer 4 has a plurality of laterally separated sub-sections which in each case extend throughout the dielectric layer and are in electrical contact to the second semiconductor layer 22. Moreover, an intermediate layer 92 is formed between the substrate 9 and the semiconductor layer 2. The intermediate layer 92 may increase the quality of the epitaxially grown semiconductor body 2. In particular, the intermediate layer 92 is an electrically conductive layer having a low band-gap compared to a band-gap of the semiconductor layers of the semiconductor body 2.

Figure 17B:
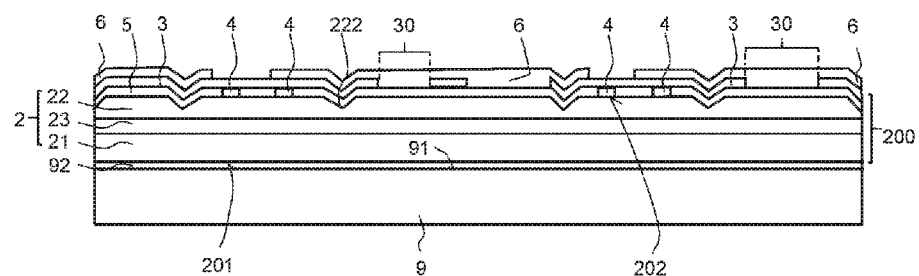

In FIG. 17B, the mirror layer 3 is applied on the patterned second main surface 202, such that the mirror layer 3 reproduces the patterned second main surface 201 at least in places forming the plurality of micro-prisms 222. The mirror layer 3 is in electrical contact with the connection layer 4. The insulating layer 6 is also patterned.

Figure 17C:
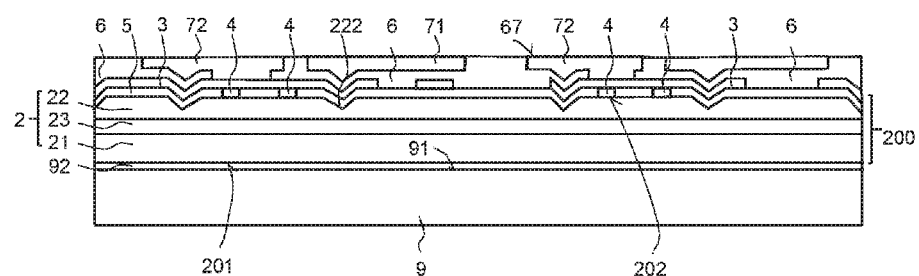

In FIG. 17C, the first contact area 71 and the second contact area 72 of the contact structure 7 are formed on a side of the semiconductor layer sequence 200 remote from the substrate 9, wherein the planar connection surface 67 is formed by surfaces of the first contact area 71, the second contact area 72 and the insulating layer 6. The entire planar connection surface 67 is free of elevations or depressions.

Figure 17D:
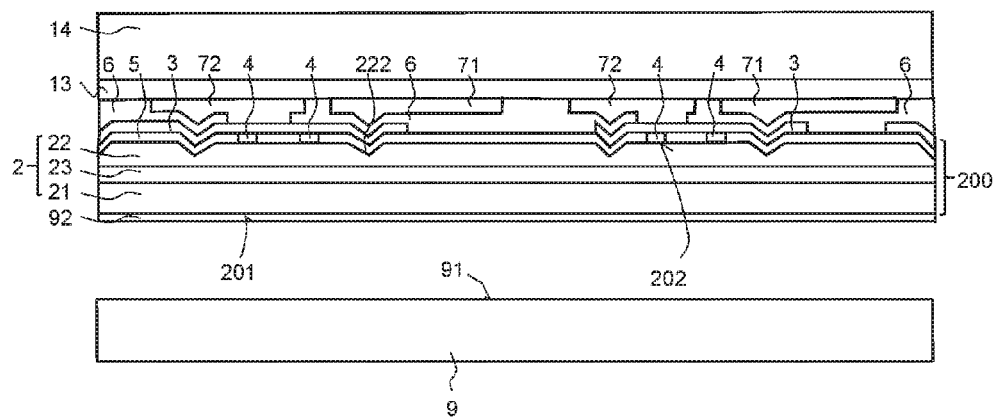
Figure 17E:
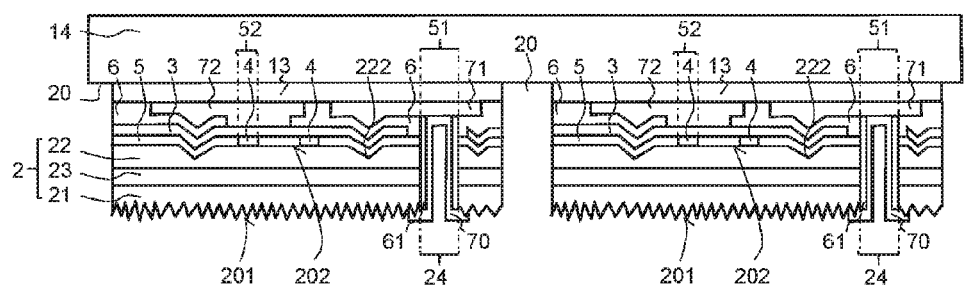

The production steps illustrated in FIGS. 17D and 17E correspond essentially to the production steps described in FIGS. 8 through 10. In contrast thereto, the recesses 24 and the vias 70 are formed after the substrate 9 has been removed. In vertical direction, the recess 24 extends from the first main surface 201 throughout the entire semiconductor layer sequence 200 as far as to the first contact area 71. The via 70 extends in vertical direction from the first contact area 71 to the first main surface 201 and is in particular in direct electrical contact with the first semiconductor layer 21 at the first main surface 201.

Figure 17F:
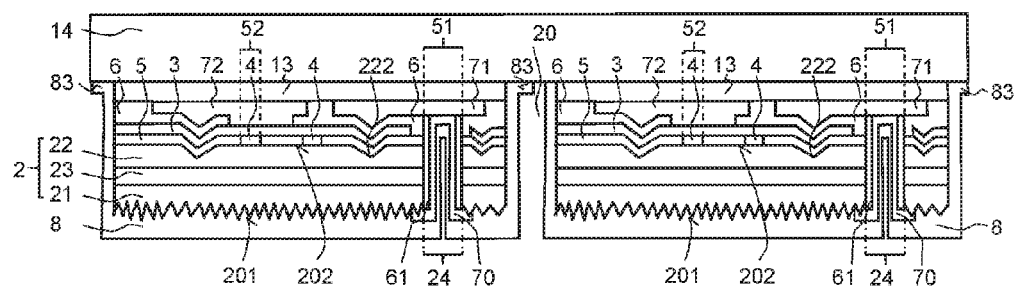
Figure 17G:
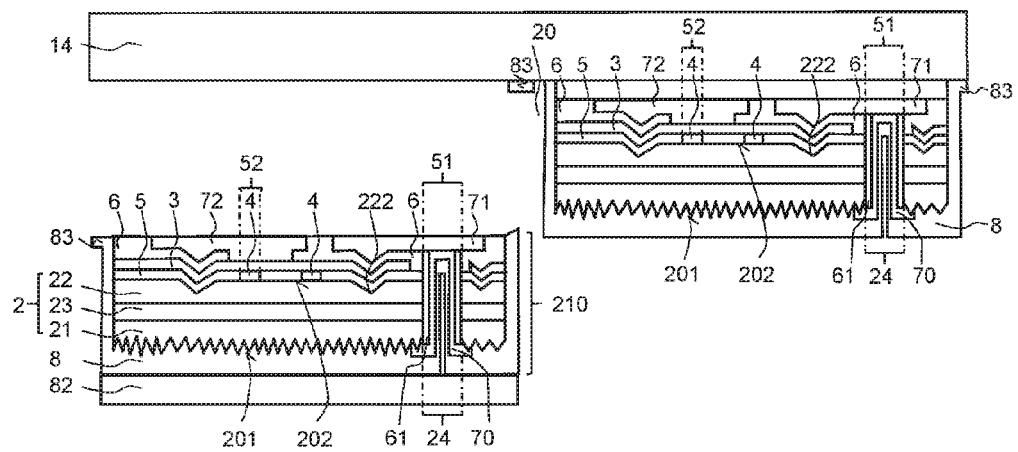

The further production steps illustrated in FIGS. 17F and 17G correspond essentially to the production steps described in FIGS. 12 and 13, wherein the main body 210 has a via 70 extending throughout the semiconductor body 2. The main body 210 may be selectively lifted from the auxiliary substrate 14 such that the tethers 83 are mechanically broken, wherein the tethers 83, or at least some remnants of the tethers 83, are detached from the auxiliary substrate 14. The anchoring layer 8 of the selectively lifted main body 210 comprises the tethers 83, or at least some remnants of the tethers 83, after being completely removed from the auxiliary substrate 14.

Figure 17H:
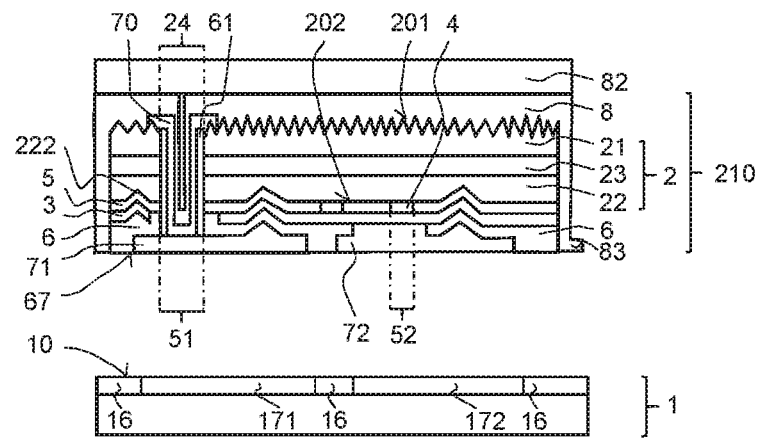

The production step illustrated in FIG. 17H corresponds essentially to the production step described in FIG. 14. In contrast thereto, the planar connection surface 67 is free of the recess 24. In this case the entire planar connection surface 67 is in particular free of elevations or depressions.

Figure 17I:
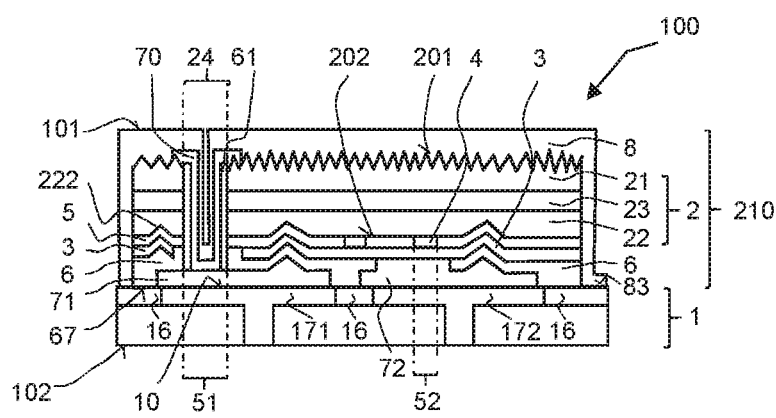
FIG. 17I shows a further exemplified embodiment of a semiconductor component.

FIG. 17I shows a further exemplified embodiment of a semiconductor component 100 comprising the main body 210 illustrated in FIG. 17G and the carrier 1 as illustrated in FIG. 16. This semiconductor component 100 comprises the anchoring layer 8 having at least one tether 83 or remnants of the tether 83 arranged on the bonding surface 10 of the carrier 1. The anchoring layer 8 covers at least one vertical surface of the semiconductor body 2, wherein the tether 83 or remnants of the tether 83 are arranged sideways from the semiconductor body 2. The anchoring layer 8 may be partially or completely removed. In particular, the anchoring layer 8 may be formed from a material, which radiation-transmissive or transparent to radiations emitted by the active region 23. In this case, a surface of the anchoring layer 8 remote from the carrier 1 may be formed as the radiation exit area 101 of the component. In FIG. 17I, the recess 24 is not completely filled by the anchoring layer 8. It is also possible that the recess 24 is completely filled by a material of the anchoring layer 8 or by another materials.

Using tethers for binding semiconductor bodies to an auxiliary substrate, wherein the tethers are formed within mesa trenches separating the semiconductor bodies, the semiconductor bodies may be held in place during and after the process of detaching the auxiliary substrate. The semiconductor bodies may then be selectively picked up and direct-bonded to a carrier, wherein no extra steps for electrical interconnection of the semiconductor body to the carrier are needed. By using the tethers, the method for producing a plurality of semiconductor components is simplified, resulting in a reduction of production costs.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor component comprising:
a carrier having a planar bonding surface; and
a main body arranged on the carrier, wherein the main body comprises:
   a semiconductor body having a first main surface remote from the carrier and a second main surface facing the carrier, wherein the semiconductor body comprises a first semiconductor layer, a second semiconductor layer and an active region being arranged between the first semiconductor layer and the second semiconductor layer;
   a contact structure having a via extending from the second main surface throughout the second semiconductor layer and the active region for electrically contacting the first semiconductor layer, wherein the contact structure comprises a first contact area being electrically connected to the via and a second contact area on a side of the second main surface, wherein the first contact area and the second contact area are laterally separated by an insulating layer; and
   a planar connection surface formed by surfaces of the first contact area, the second contact area and the insulating layer,
wherein the planar bonding surface is in direct contact with the planar connection surface of the main body thereby forming a common interface between the main body and the carrier, and
wherein the common interface is free of any adhesive material.

2. The semiconductor component according to claim 1, wherein the carrier further comprises a first contact pad and a second contact pad laterally separated from the first contact pad by an insulating pad, wherein the planar bonding surface is formed by surfaces of the first contact pad, the second contact pad and the insulating pad, and wherein the common interface is formed partially by a metal-metal-interface, an insulating-insulating-interface and a metal-insulating-interface.

3. The semiconductor component according to claim 1, wherein the second main surface comprises a patterned second main surface having a plurality of micro-prisms, wherein a mirror layer is arranged between the second main surface and the carrier and wherein the mirror layer reproduces the patterned second main surface at least in places.

4. A device comprising a plurality of the semiconductor components according to claim 1, wherein the carriers of all the semiconductor components are formed as a single common carrier.

5. A method for producing a plurality of semiconductor components each having the semiconductor body according to claim 1, the method comprising:
   applying a semiconductor layer sequence having a first semiconductor layer, a second semiconductor layer and an active region being disposed between the first semiconductor layer and the second semiconductor layer on a substrate;
   forming contact structures for electrically contacting the first semiconductor layer and the second semiconductor layer;
   structuring the semiconductor layer sequence by forming trenches separating the semiconductor bodies;
   applying an auxiliary substrate on the semiconductor layer sequence, so that the semiconductor layer sequence is arranged between the auxiliary substrate and the substrate;
   removing the substrate from the semiconductor layer sequence;
   applying an anchoring layer covering the trench and vertical surfaces of the semiconductor bodies;
   forming a plurality of tethers by structuring the anchoring layer in regions covering the trench;
   locally detaching the auxiliary substrate from the semiconductor bodies, wherein the tethers remain attached to the auxiliary substrate; and
   selectively picking up each semiconductor body by separating the tethers from the auxiliary substrate, each semiconductor body comprising a portion of the first semiconductor layer, a portion of the second semiconductor layer and a portion of the active region together with an associated contact structure.

6. The method according to claim 5, wherein applying the anchoring layer is carried out prior to locally detaching the auxiliary substrate, and wherein the semiconductor bodies are held in place by the tethers during locally detaching the auxiliary substrate.

7. The method according to claim 5, wherein applying the anchoring layer comprises forming the anchoring layer from a dielectric material, and wherein forming the plurality of tethers comprises forming the plurality of tethers by etching the anchoring layer.

8. The method according to claim 5, wherein applying the anchoring layer comprises forming the anchoring layer from a photoresist material, and wherein forming the plurality of tethers comprises forming the plurality of tethers by a photolithography process.

9. The method according to claim 5, wherein both steps locally detaching the auxiliary substrate and forming the plurality of tethers are carried out by a photolithography process.

10. The method according to claim 5, wherein structuring the anchoring layer comprises disconnecting the tethers associated with the semiconductor bodies.

11. The method according to claim 5, wherein forming the anchoring layer comprises forming an anchor bar between the semiconductor bodies by structuring the anchoring layer in regions covering the trench and the semiconductor bodies are connected to the anchor bar by the tethers.

12. The method according to claim 5, further comprising providing the substrate with a patterned surface and growing the semiconductor layer sequence onto the patterned surface of the substrate such that the semiconductor layer sequence comprises a patterned first main surface facing and reproducing the patterned surface of the substrate.

13. The method according to claim 5, wherein prior to forming the contact structure the semiconductor layer sequence is patterned on a side remote from the substrate such that a patterned second main surface of the semiconductor layer sequence remote from the substrate is formed which comprises micro-prisms.

14. The method according to claim 13, further comprising applying a mirror layer on the patterned second main surface such that the mirror layer reproduces the patterned second main surface at least in places.

15. The method according to claim 5, wherein a first contact area and a second contact area of the contact structure and an insulating layer are formed on a side of the semiconductor layer sequence remote from the substrate, wherein a planar connection surface is formed by surfaces of the first contact area, the second contact area and the insulating layer, the surfaces being remote from the semiconductor layer sequence.

16. The method according to claim 15, wherein selectively picking up the semiconductor body comprises selectively removing the semiconductor body from the auxiliary substrate and connecting the semiconductor body to the carrier by direct-bonding, which is free of using any adhesive material.

17. The method according to claim 16, wherein the carrier comprises a planar bonding surface, wherein prior to direct-bonding the planar bonding surface to the planar connection surface, the planar bonding surface and the planar connection surface are surface-finished by plasma cleaning.

18. The method according to claim 5, wherein the contact structure is formed on a main surface of the semiconductor layer sequence facing away from the substrate, and wherein the contact structure comprises a first contact area, a via and a second contact area, the second contact area being electrically connected to the second semiconductor layer, the via being electrically connected to the first contact area and extending from the main surface throughout the second semiconductor layer and the active region into or throughout the first semiconductor layer.

19. A method for producing a plurality of semiconductor components according to claim 1, the method comprising:
    forming a semiconductor layer sequence;
    structuring the semiconductor layer sequence by forming trenches thereby structuring a plurality of semiconductor bodies;
    applying an auxiliary substrate on the semiconductor layer sequence, so that the semiconductor layer sequence is arranged between the auxiliary substrate and a substrate;
    removing the substrate from the semiconductor layer sequence;
    applying an anchoring layer covering the trench and vertical surfaces of the semiconductor bodies;
    forming a plurality of tethers by structuring the anchoring layer in regions covering the trench;
    locally detaching the auxiliary substrate from the semiconductor bodies, wherein the tethers remain attached to the auxiliary substrate; and
    selectively picking up each semiconductor body of the plurality of semiconductor bodies by separating the tethers from the auxiliary substrate, the semiconductor body comprising a portion of the semiconductor layer sequence.

20. A method for producing a plurality of semiconductor components according to claim 1, the method comprising:
    forming a semiconductor layer sequence;
    structuring the semiconductor layer sequence by forming trenches thereby structuring a plurality of semiconductor bodies;
    applying an auxiliary substrate on the semiconductor layer sequence, so that the semiconductor layer sequence is arranged between the auxiliary substrate and a substrate;
    removing the substrate from the semiconductor layer sequence;
    applying an anchoring layer covering the trench and vertical surfaces of the semiconductor bodies;
    forming a plurality of tethers by structuring the anchoring layer in regions covering the trench;
    locally detaching the auxiliary substrate from the semiconductor bodies, wherein the tethers remain attached to the auxiliary substrate; and
    selectively picking up each semiconductor body of the plurality of semiconductor bodies by separating the tethers from the auxiliary substrate, the semiconductor body comprising a portion of the semiconductor layer sequence and forming the main body of one semiconductor component.

\* \* \* \* \*